United States Patent
Kim et al.

(10) Patent No.: US 7,670,748 B2
(45) Date of Patent: Mar. 2, 2010

(54) CYCLIC COMPOUND, PHOTORESIST COMPOSITION AND METHOD OF FORMING A PHOTORESIST PATTERN USING THE SAME

(75) Inventors: Kyoung-Mi Kim, Gyeonggi-do (KR); Young-Ho Kim, Gyeonggi-do (KR); Jin-Baek Kim, Seoul (KR); Tae-Hwan Oh, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 416 days.

(21) Appl. No.: 11/638,590

(22) Filed: Dec. 14, 2006

(65) Prior Publication Data
US 2007/0141511 A1 Jun. 21, 2007

(30) Foreign Application Priority Data
Dec. 15, 2005 (KR) .................... 10-2005-0123628

(51) Int. Cl.
 G03F 7/00 (2006.01)
 G03F 7/004 (2006.01)
(52) U.S. Cl. .............. 430/270.1; 430/330; 430/913; 430/927; 430/945
(58) Field of Classification Search .......... 430/270.1, 430/311, 330, 913, 927, 945
See application file for complete search history.

(56) References Cited

U.S. PATENT DOCUMENTS

2007/0141511 A1* 6/2007 Kim et al. ............ 430/270.1

FOREIGN PATENT DOCUMENTS

| JP | 2002-365803 | 12/2002 |
| JP | 2004-323452 | 11/2004 |
| KR | 0271420 | 8/2000 |

OTHER PUBLICATIONS

English language machine translation of JP 2002-365803.*
English language machine translation of JP 2004-323452.*

* cited by examiner

*Primary Examiner*—Amanda C. Walke
(74) *Attorney, Agent, or Firm*—Volentine & Whitt, PLLC

(57) ABSTRACT

A photoresist composition includes a cyclic compound, a photoacid generator, and an organic solvent. The cyclic compound includes any one selected from the group consisting of moieties having chemical structures represented by the formulae (1), (2), (3) and (4) set forth herein, and at least one moiety having the chemical structure represented by the formula (9) set forth herein.

13 Claims, 2 Drawing Sheets

CYCLIC COMPOUND, PHOTORESIST COMPOSITION AND METHOD OF FORMING A PHOTORESIST PATTERN USING THE SAME

BACKGROUND OF THE INVENTION

1. Field of the Invention

Example embodiments of the present invention relate to a cyclic compound, a photoresist composition including the cyclic compound, and a method of forming a pattern using the photoresist composition. More particularly, example embodiments of the present invention relate to a cyclic compound having a polycyclic structure, a photoresist composition including the cyclic compound, and a method of forming a photoresist pattern using the photoresist composition.

A claim of priority under 35 U.S.C. § 119 is made to Korean Patent Application No. 2005-123628, filed on Dec. 15, 2005, the contents of which are herein incorporated by reference in their entireties for all purpose.

2. Description of the Related Art

Photolithography is an integral process in the fabrication of semiconductor devices. Part of that process involves the formation of an etching mask by patterning a layer of photoresist composition to define a photoresist pattern. In the case of a chemically amplified photoresist, the composition is typically prepared by mixing a polymer having an acid-labile group, a photoacid generator and a solvent. The photoresist composition exhibits variable solubility in a developing solution depending on its exposure to light. The patterning process generally includes the sequentially executed steps of coating a substrate (or layer) with a photoresist composition to form a photoresist film, partially exposing the photoresist film to light, and developing (removing) the exposed portions of the photoresist film in a developing solution.

The photoresist composition conventionally includes a polymer having a high molecular weight. However, the relatively large molecular size of conventional photoresist polymers can make it difficult to realize further reductions in line widths of photoresist patterns. Also, the molecular weight and molecular size can vary in conventional photoresist polymers, and such polymers are characterized by entangled polymer structures. When the photoresist is developed, molecules of the polymer swell in size in the developing solution, and do not dissolve at a constant rate in the developing solution. This adversely impacts the resolution and line width roughness of the photoresist pattern.

Assume, for example, that the line edge roughness resulting from the use of a conventional photoresist composition is 20 nm on each side of line pattern. For semiconductor devices fabricated with 240 nm line width dimensions, the line width roughness is about 16% of the line width. Recently, however, semiconductor devices having 90 nm line width dimensions are being developed, and the line width roughness of such devices becomes roughly 22% of the line width. For semiconductor devices having 70 nm line width dimensions, the line width roughness becomes about 29% of the line width. It can thus be seen that line edge roughness is an impediment to reducing line width dimensions of semiconductor devices.

SUMMARY OF THE INVENTION

According to one aspect of the present invention, a cyclic compound for a photoresist composition includes any one selected from the group consisting of moieties having chemical structures represented by formulae (1), (2), (3) and (4), and at least one moiety having a chemical structure represented by a formula (9),

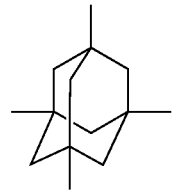

(1)

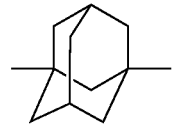

(2)

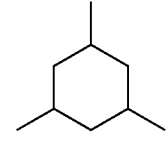

(3)

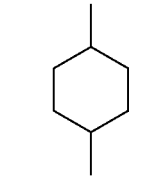

(4)

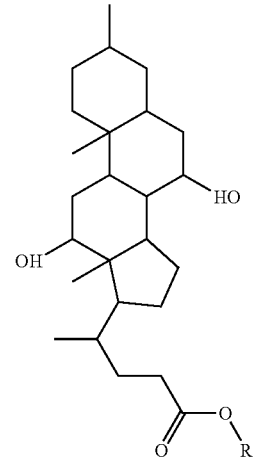

(9)

In the formula (9), R is a tert-butyl group or a 1-(tert-butoxy)ethyl group.

According to another aspect of the present invention, a photoresist composition includes a cyclic compound, a photoacid generator, and an organic solvent. The cyclic compound includes any one selected from the group consisting of moieties having chemical structures represented by the above formulae (1), (2), (3) and (4), and at least one moiety having the chemical structure represented by the above formula (9).

According to still another aspect of the present invention, there is provided a method of forming a pattern. In the method of forming the pattern, a photoresist film is formed on an object by coating the object with a photoresist composition. The photoresist composition includes a cyclic compound, a photoacid generator, and an organic solvent. The cyclic compound includes any one selected from the group consisting of moieties having chemical structures represented by the above formulae (1), (2), (3) and (4), and at least one moiety having the chemical structure represented by the above formula (9). The photoresist film is exposed to a light by performing an exposure process, and then the photoresist film is developed using a developing solution to form a photoresist pattern.

BRIEF DESCRIPTION OF THE DRAWINGS

The above and other features and advantages of the present invention will become readily apparent from the detailed descript that follows, with reference to the accompanying drawings, in which.

DETAILED DESCRIPTION OF EMBODIMENTS

Figure 1:
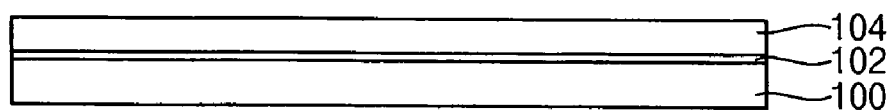
FIGS. 1 to 3 are a cross-sectional views illustrating a method of forming a photoresist pattern in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another elements or features as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented rotated 90 degrees or at other orientations and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments and intermediate structures of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Cyclic Compound

A cyclic compound of the present invention has a nonlinear molecule including a protecting group, an adhesion portion and a cyclic core portion. Without limiting the scope of the invention, it is noted that the cyclic compound may exhibit characteristics as enumerated below.

First, the cyclic compound has a single molecular weight and a definite molecular structure, and thus there is no distribution (or variance) in molecular weight. Second, each "building block" of a photoresist pattern formed by the cyclic compound is a single molecule, and thus the photoresist pattern may have a molecular level resolution. Third, the cyclic compound may enhance the difference in solubility between a light-exposed portion and an unexposed portion on the photoresist film, and thus the photoresist film may be more uniformly developed. Since the cyclic compound has a small molecular size, a short rotational radius and a complex three-dimensional structure, a molecular interaction such as a chain entanglement may not be generated. Fourth, since there is no chain entanglement, a line width roughness of the photoresist pattern may be substantially reduced. Fifth, the cyclic compound has a glass transition temperature which is substantially higher than that of a conventional resin used in a photoresist composition.

The cyclic compound according to example embodiments of the present invention includes any one selected from the group consisting of moieties having chemical structures represented by formulae (1), (2), (3) and (4), and at least one moiety having a chemical structure represented by a formula (9),

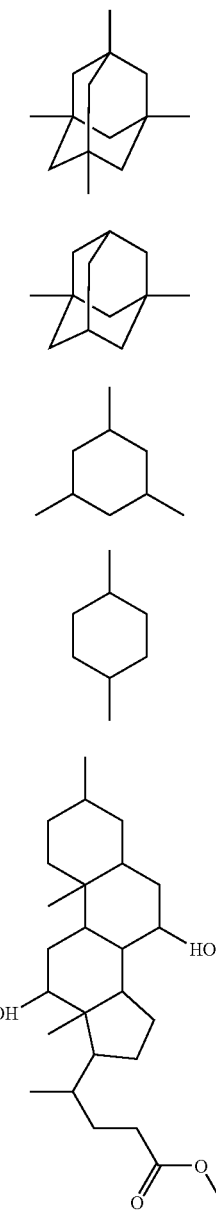

(1)

(2)

(3)

(4)

(9)

In the formula (9), R is a tert-butyl group or a 1-(tert-butoxy)ethyl group.

In accordance with an example embodiment of the present invention, the cyclic compound may include the moiety represented by the formula (1), and the cyclic compound may have a chemical structure represented by a formula (5),

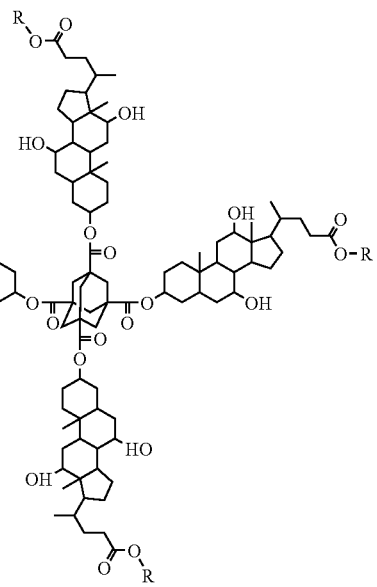

(5)

In the formula (5), R may be a. protecting group of the cyclic compound, and examples of R may include a tert-butyl group or a 1-(tert-butoxy)ethyl group.

The compound represented by the formula (5) may be synthesized by reacting 1,3,5,7-adamantanetetracarboxylic acid having a chemical structure represented by a formula (10) with a bile acid derivative such as tert-butylcholate or 1-(tert-butoxy)ethylcholate having a chemical structure represented by a formula (15),

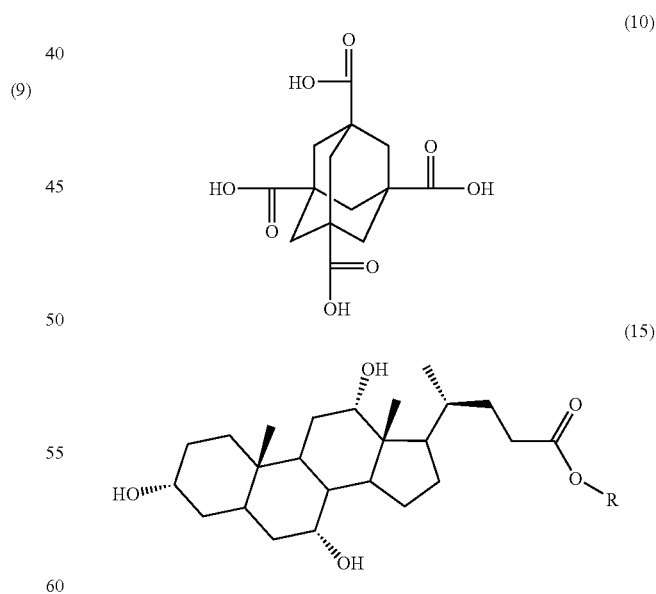

(10)

(15)

In the formula (15), R may be a tert-butyl group or a 1-(tert-butoxy)ethyl group.

When the bile acid derivative is tert-butylcholate, the compound of the formula (5) is 1,3,5,7-adamantanetetracarboxylic acid tetrakis(tert-butylcholate) ester. When the bile acid derivative is 1-(tert-butoxy)ethylcholate, the compound of the formula (5) is 1,3,5,7-adamantanetetracarboxylic acid tetrakis(1-(tert-butoxy)ethylcholate) ester.

In accordance with another example embodiment of the present invention, the cyclic compound may include the moiety represented by the formula (2), and the cyclic compound may have a chemical structure represented by a formula (6),

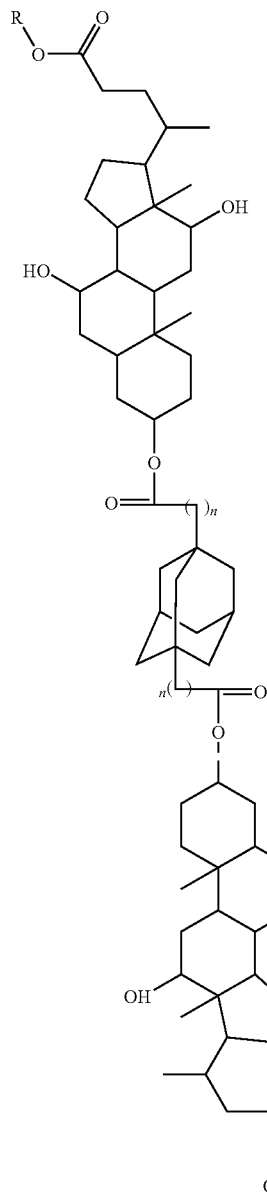

(6)

In the formula (6), R may be a protecting group of the cyclic compound, examples of R may include a tert-butyl group or a 1-(tert-butoxy)ethyl group, and n may be 0 or 1.

When n is 0, for example, the compound represented by the formula (6) may be synthesized by reacting 1,3-adamantanedicarboxylic acid having a chemical structure represented by a formula (11) with a bile acid derivative such as tert-butylcholate or 1-(tert-butoxy)ethylcholate.

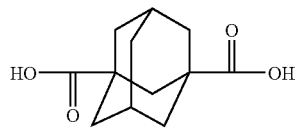

(11)

When the bile acid derivative is tert-butylcholate, the compound of the formula (6) is 1,3-adamantanedicarboxylic acid bis(tert-butylcholate) ester. When the bile acid derivative is 1-(tert-butoxy)ethylcholate, the compound of the formula (6) is 1,3-adamantanedicarboxylic acid bis(1-(tert-butoxy)ethylcholate) ester.

When n is 1, for example, the compound represented by the formula (6) may be synthesized by reacting 1,3-adamantanediacetic acid having a chemical structure represented by a formula (12) with a bile acid derivative such as tert-butylcholate or 1-(tert-butoxy)ethylcholate.

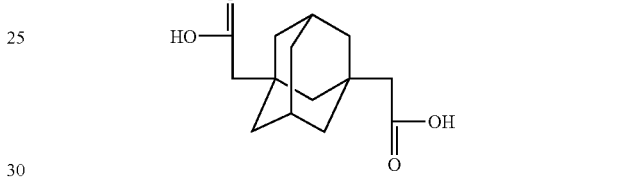

(12)

When the bile acid derivative is tert-butylcholate, the compound represented by the formula (6) is 1,3-adamantanediacetic acid bis(tert-butylcholate) ester. When the bile acid derivative is 1-(tert-butoxy)ethylcholate, the compound represented by the formula (6) is 1,3-adamantanediacetic acid bis(1-(tert-butoxy)ethylcholate) ester.

In accordance with another example embodiment of the present invention, the cyclic compound may include the moiety represented by the formula (3), and the cyclic compound may have a chemical structure represented by a formula (7),

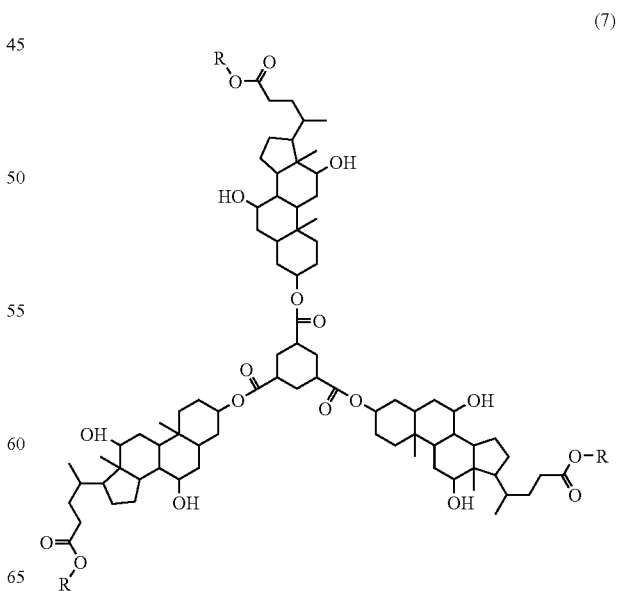

(7)

In the formula (7), R may be a protecting group of the cyclic compound, and examples of R may include a tert-butyl group or a 1-(tert-butoxy)ethyl group.

The compound represented by the formula (7) may be synthesized by reacting 1,3,5-cyclohexanetricarboxylic acid having a chemical structure represented by a formula (13) with a bile acid derivative such as tert-butylcholate or 1-(tert-butoxy)ethylcholate.

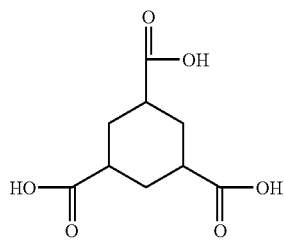

(13)

When the bile acid derivative is tert-butylcholate, the compound of the formula (13) is 1,3,5-cyclohexanetricarboxylic acid tris(tert-butylcholate) ester. When the bile acid derivative is 1-(tert-butoxy)ethylcholate, the compound of the formula (13) is 1,3,5-cyclohexanetricarboxylic acid tris(1-(tert-butoxy)ethylcholate) ester.

In accordance with another example embodiment of the present invention, the cyclic compound may include the moiety represented by the formula (4), and the cyclic compound may have a chemical structure represented by a formula (8), (8)

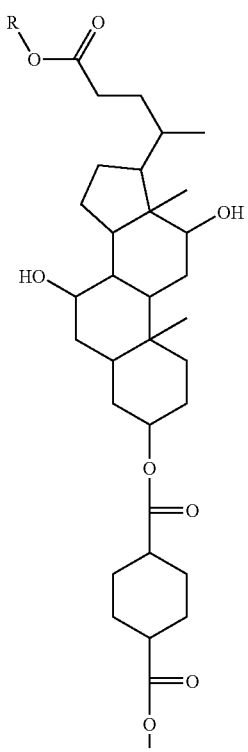

-continued

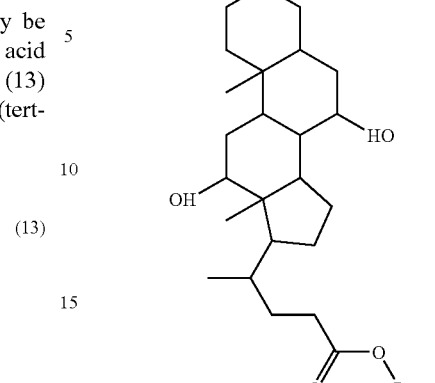

In the formula (8), R may be a protecting group of the cyclic compound, and examples of R may include a tert-butyl group or a 1-(tert-butoxy)ethyl group.

The compound represented by the formula (8) may be synthesized by reacting 1,4-cyclohexanedicarboxylic acid having a chemical structure represented by a formula (14) with a bile acid derivative such as tert-butylcholate or 1-(tert-butoxy)ethylcholate.

(14)

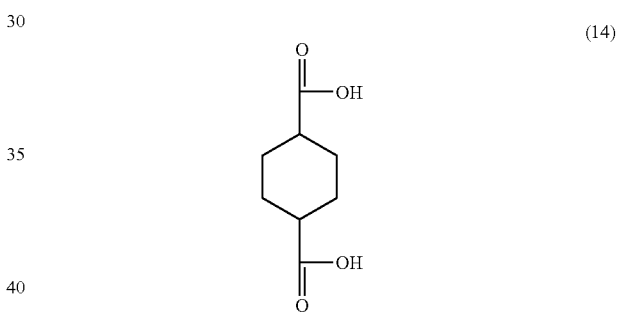

The protecting groups included in the compounds, which are represented by the formulae (5), (6), (7) and (8), may be easily removed from the compounds when exposed to energy (e.g., light) by reacting with an acid. The hydroxyl group (OH) included in the compound may be a hydrophilic portion.

The cyclic compounds having the above-mentioned chemical structures may have flexible chain structures, and therefore the cyclic compounds may exhibit amorphous, rather than crystalline, characteristics. Thus, photoresist films including the cyclic compounds may be formed by spin-coating. Furthermore, the cyclic compounds may have a relatively high glass transition temperature. Accordingly, when the cyclic compounds are included a photoresist composition, a photoresist pattern having a fine width dimension and an improved etching resistance may be formed.

Photoresist Composition

A photoresist composition of the present invention includes a cyclic compound, a photoacid generator and an organic solvent. The cyclic compound, which is described above, includes any one selected from the group consisting of moieties having chemical structures represented by the above formulae (1), (2), (3) and (4), and at least one moiety having a chemical structure represented by the above formula (9).

When the photoresist composition includes less than about 7 percent by weight of the cyclic compound based on a total weight of the photoresist composition, a photoresist pattern may exhibit poor etching resistance which renders the photoresist pattern ineffective as an etching mask. On the other hand, when the amount of the cyclic compound is greater than about 14 percent by weight, it may be difficult to form a photoresist film having a substantially uniform thickness on the object. Therefore, the photoresist composition may preferably include about 7 to about 14 percent by weight of the cyclic compound, based on a total weight of the photoresist composition. For example, when the photoresist composition is applied to form a photoresist pattern having a line width less than about 70 nm by utilizing a wavelength of about 193 nm, the photoresist composition may preferably include about 9 to about 12 percent by weight of the cyclic compound.

The cyclic compound may be a low molecular weight compound represented by the formulae (5), (6), (7) or (8). The cyclic compound may include a hydroxyl group (OH) as a hydrophilic portion, and may include tert-butylcholate or 1-(tert-butoxy)ethylcholate as a protecting group. Due to its flexible chain structure, the cyclic compound may not have crystalline properties, which are a general characteristic of a low molecular weight compound. Since the cyclic compound may have amorphous characteristics, the cyclic compound may be applied to a spin-coatable photoresist composition. In addition, the cyclic compound may improve an etching resistance of a photoresist pattern since the cyclic compound has a polycyclic structure.

In the photoresist composition according to an example embodiment of the present invention, a certain quantity of an acid ($H^+$) and heat may be required to detach the protecting group from the cyclic compounds represented by the formulae (5), (6), (7) or (8). The acid may be generated from a photoacid generator included in the photoresist composition. The photoacid generator may generate an acid when exposed to light.

When the photoresist composition includes less than about 0.1 percent by weight of the photoacid generator based on a total weight of the photoresist composition, a sufficient quantity of acid may not be generated during an exposure process to reliably detach the protecting group from the cyclic compounds. On the other hand, when the amount of the photoacid generator is greater than about 0.5 percent by weight, an overproduction of acid may result in the exposure process, and thus the photoresist film may be excessively developed in a developing process and a top portion loss of a photoresist pattern may occur. Therefore, the photoresist composition may preferably include about 0.1 to about 0.5 percent by weight of the photoacid generator, and more preferably about 0.2 to about 0.4 percent by weight of the photoacid generator.

Non-limiting examples of the photoacid generator that may be applied to the photoresist composition may include a triarylsulfonium salt, a diaryliodonium. salt, a sulfonate, and N-hydroxysuccinimde triflate. These can be used individually or in a mixture of two or more thereof.

More specific non-limiting examples of the photoacid generator may include triphenylsulfonium triflate, triphenylsulfonium antimonate, diphenyliodonium triflate, diphenyliodonium antimonate, methoxydiphenyliodonium triflate, di-tert-butyidiphenyliodonium triflate, 2,6-dinitrobenzyl sulfonate, pyrogallol tris(alkylsulfonate), norbomene dicarboximide triflate, triphenylsulfonium nonaflate, diphenyliodonium nonaflate, methoxydiphenyliodonium nonaflate, di-tert-butyidiphenyliodonium nonaflate, N-hydroxysuccinimide nonaflate, norbornene dicarboximide nonaflate, triphenyl sulfonium perfluorooctanesulfonate, diphenyliodonium perfluorooctanesulfonate, methoxyphenyliodonium perfluorooctanesulfonate, di-tert-butyidiphenyliodonium triflate, N-hydroxysuccinimide perfluorooctanesulfonate, and norbomene dicarboximide perfluorooctanesulfonate. These can be used individually or in a mixture of two or more thereof.

Non-limiting examples of the organic solvent that may be used in the photoresist composition may include ethyleneglycol monomethyl ether, ethyleneglycol monoethyl ether, propyleneglycol methyl ether, methyl cellosolve acetate, ethyl cellosolve acetate, diethyleneglycol monomethyl ether, diethyleneglycol monoethyl ether, propyleneglycol methylether acetate, propyleneglycol propylether acetate, diethyleneglycol dimethyl ether, ethyl lactate, toluene, xylene, methyl ethyl ketone, cyclohexanone, 2-heptanone, 3-heptanone, and 4-heptanone. These can be used individually or in a mixture of two or more thereof.

In an example embodiment of the present invention, the photoresist composition may further include an additive in order to improve characteristics of photoresist. Examples of the addictive may include an organic base. The organic base may prevent an alkali compound such as an amine in the air from influencing the shape of the photoresist pattern obtained after the exposure process.

Non-limiting examples of the organic base that may be used in the photoresist composition may include triethylamine, triisobutylamine, triisooctylamine, triisodecylamine, diethanolamine, and triethanolamine. These can be used individually or in a mixture of two or more thereof.

Method of Forming a Pattern

Figure 2:
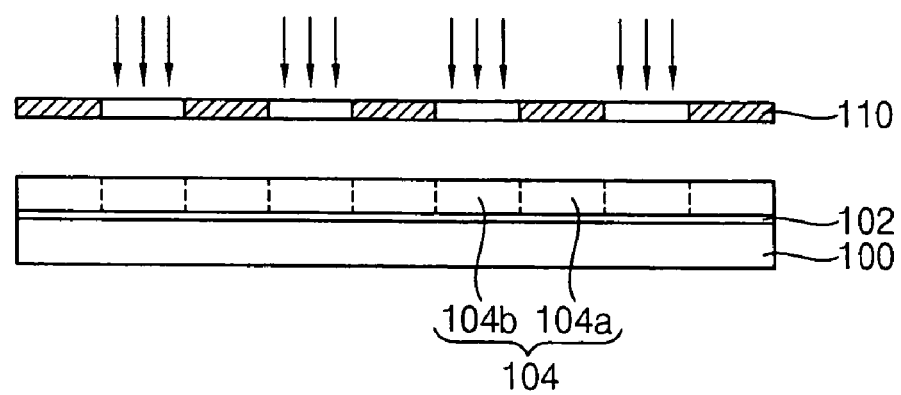
Figure 3:
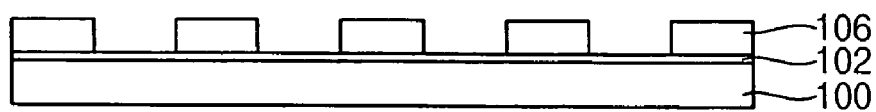

FIGS. 1 to 3 are cross-sectional views illustrating a method of forming a pattern in accordance with an example embodiment of the present invention.

Referring to FIG. 1, an etching object is prepared. The etching object may be, for example, a film 102 formed on a semiconductor substrate 100. The case where the etching object is a hard mask film 102 will be described hereinafter. The hard mask film 102 may be formed on the semiconductor substrate 100 by spin-coating. The hard mask film 102 may exhibit certain favorable characteristics related to gap-filling, planarization, uniformity, anti-reflection and etching resistance.

The semiconductor substrate 100 having the hard mask film 102 may be rinsed to remove contaminants from the hard mask film 102. A photoresist film 104 may be formed on the hard mask film 102 by coating with a photoresist composition including a cyclic compound, a photoacid generator and an organic solvent.

The photoresist composition includes, according to example embodiments described previously, about 7 to about 14 percent by weight of the cyclic compound including any one selected from the group consisting of moieties having chemical structures represented by above formulae (1), (2), (3) and (4), and at least one moiety having a chemical structure represented by the above formula (9); about 0.1 to about 0.5 percent by weight of the photoacid generator; and an organic solvent. The composition may further include, for example, an additive as described previously.

The semiconductor substrate 100 on which the photoresist film 104 is formed may be thermally treated in a first baking process. The first baking process may be performed, for example, at a temperature of about 90° C. to about 120° C. In the first baking process, an adhesive characteristic of the photoresist film 104 relative to the hard mask film 102 may be enhanced.

Referring to FIG. 2, the photoresist film 104 is selectively exposed to light. In particular, a mask 110 having a predetermined pattern may be positioned on a mask stage of an exposure apparatus, and then the mask 110 may be aligned over the photoresist film 104. A portion of the photoresist film 104 formed on the substrate 100 may be selectively reacted with light transmitted through the mask 110 while the light is irradiated on the mask 110 for a predetermined period of time.

Non-limiting examples of the light that may be used in the exposure process may include an ArF laser having a wavelength of about 193 nm, an $F_2$ laser, a mercury-xenon(Hg—Xe) light, a far ultraviolet light, and an X-ray and an ion beam.

An exposed portion 104b of the photoresist film 104 may have hydrophilicity which is substantially higher than that of an unexposed portion 104a of the photoresist film 104. Accordingly, the exposed portion 104b and the unexposed portion 104a of the photoresist film 104 may exhibit different solubility characteristics from one another.

Subsequently, a second baking process may be performed on the semiconductor substrate 100. The second baking process may be performed, for example, at a temperature of about 90° C. to about 150° C. In the second baking process, the exposed portion 104b of the photoresist film 104 may become soluble in a developing solution.

Referring to FIG. 3, a photoresist pattern 106 may be formed by dissolving the exposed portion 104b of the photoresist film 104 in the developing solution and then removing the exposed portion 104b from the photoresist film 104. In particular, the exposed portion 104b of the photoresist film 104 may be removed by dissolving the exposed portion 104b of the photoresist film 104 utilizing, for example, an aqueous solution of tetramethylammonium hydroxide as the developing solution. As mentioned above, the exposed portion 104b of the photoresist film 104 may have hydrophilicity which is substantially different from that of the unexposed portion 104b of the photoresist film 104, and thus the exposed portion 104b of the photoresist film 104 may be easily removed when dissolved in the developing solution. The semiconductor substrate 100 having the photoresist pattern 106 may be rinsed and dried to complete the photoresist pattern 106.

Example embodiments of the present invention will be further described below through examples of preparing bile acid derivatives and cyclic compounds.

EXAMPLE 1

Synthesis of tert-Butylcholate

About 10 g, i.e., 0.02 moles of cholic acid was dissolved in about 200 mL of purified tetrahydrofuran under a nitrogen atmosphere. While the solution. was kept at a temperature of about 0° C., about 30 mL of anhydrous trifluoroacetic acid was slowly added to the solution. After the solution was reacted at a room temperature for about two hours, about 60 mL of tert-butyl alcohol was slowly added to the solution that was kept at a temperature of about 0° C. Thereafter, the solution was reacted at a room temperature for about twelve hours, and then was cooled to a temperature of about 0° C. After about 40 mL of about 28% w/w ammonia water was added to the solution, the solution was reacted at a temperature of about 0° C. for about twenty hours. After the reaction was completed, about 20 mL of ammonia water was additionally added to the solution and the solution was reacted at a room temperature for six hours. Subsequently, an organic material was obtained by utilizing about 300 mL of diethyl ether and about 200 mL of water. The obtained organic material was cleaned using about 1M of NaOH solution and salt water. Thereafter, water was removed using anhydrous magnesium sulfonate, the resulting solution was filtered, and solvent was removed. As a result, a white solid material was obtained. A final product was recrystalized from an acetonitrile solution including the white solid material, and thus about 9 g of pure tert-butylcholate was obtained. The yield of tert-butylcholate was about 90%.

A structure of the final product was confirmed using a 1H-nuclear magnetic resonance ($^1$H-NMR) spectrum. The $^1$H-NMR spectrum showed chemical shifts (δ) of the final product dissolved in chloroform-d ($CDCl_3$). The $^1$H-NMR spectrum showed chemical shifts (δ) of the final product at 3.94 ppm (s, 1H, $H^{12}$), 3.50-3.59 ppm (m, 1H, $H^3$), 2.10-2.49 ppm (m, 2H, $CH_2$, $H^{23}$), 1.43 ppm (s, 9H, t-butyl of COO), 1.10-1.90 ppm (m, 26H), 0.93 ppm (d, 3H, $CH_3$, $H^{21}$), 0.87 ppm (s, 3H, $CH_3$, $H^{19}$) and 0.64 ppm (s, 3H, $CH_3$, $H^{18}$). From the analysis of the $^1$H-NMR spectrum, it was confirmed that the final product was tert-butylcholate.

EXAMPLE 2

Synthesis of 1-(tert-Butoxy)ethylcholate

About 9 g of 1-(tert-butoxy)ethylcholate was obtained by performing substantially the same processes as those of Example 1 except that 1-tert-butyl ethanol was used instead of tert-butyl alcohol. The yield of the final product was about 90%.

A structure of a final product was confirmed using a 1H-nuclear magnetic resonance ($^1$H-NMR) spectrum. The $^1$H-NMR spectrum showed chemical shifts (δ) of the final product dissolved in chloroform-d ($CDCl_3$). The $^1$H-NMR spectrum showed chemical shifts (δ) of the final product at 5.49 ppm (q, 1H, acetal), 3.94 ppm (s, 1H, $H^{12}$), 3.50-3.59 ppm (m, 1H, $H^3$), 2.10-2.49 ppm (m, 2H, $CH_2$, $H^{23}$), 1.23 ppm (s, 9H, t-butyl), 1.10-1.90 ppm (m, 26H), 0.93 ppm (d, 3H, $CH_3$, $H^{21}$), 0.87 ppm (s, 3H, $CH_3$, $H^{19}$) and 0.64 ppm (s, 3H, $CH_3$, $H^{18}$). From the analysis of the $^1$H-NMR spectrum, it was confirmed that the final product was 1-(tert-butoxy)ethylcholate.

EXAMPLE 3

Synthesis of 1,3-Adamantanedicarboxylic Acid Bis(tert-butylcholate) Ester

About 0.1 g of 1,3-adamantanedicarboxylic acid was reacted with excess thionyl chloride at a temperature of about 100° C. under a nitrogen atmosphere for about two hours. After confirming the acylation reaction was completed using FT-IR, remaining thionyl chloride was removed by a distillation under a reduced pressure, and then remaining thionyl chloride was removed by a fractional distillation. Successively, after the obtained solid was dissolved in about 50 mL of purified tetrahydrofuran, about 3 g of tert-butyl cholate dissolved in about 100 mL of purified tetrahydrofuran and about 1.2 mL of triethylamine was slowly introduced into a three-neck-round-bottom flask having the obtained solution at a temperature of about 0° C. under a nitrogen atmosphere for about thirty minutes. Subsequently, after the resulting solution was reacted at a room temperature for about 24 hours, the resulting product was isolated by using diethyl ether. The resulting product was cleaned twice using about 1M of NaOH solution and was cleaned again using salt water. After water was removed using anhydrous magnesium sulfonate, a solid product was obtained by removing solvent. A final product was separated from the solid product using a column chromatography, in which a solution including ethyl acetate and hexane in a ratio of about 1:1 was used as an eluent. As a result, about 2 g of a white solid, 1,3-adamantanedicarboxylic acid bis(tert-butylcholate) ester, was obtained. The yield of 1,3-adamantanedicarboxylic acid bis (tert-butylcholate) ester was about 70%.

A structure of the final product was confirmed using a 1H-nuclear magnetic resonance ($^1$H-NMR) spectrum. The $^1$H-NMR spectrum showed chemical shifts (δ) of the final product dissolved in chloroform-d ($CDCl_3$). The $^1$H-NMR spectrum showed chemical shifts (δ) of the final product at 4.68 ppm (m, 2H, $H^3$), 3.94 ppm (s, 2H, $H^{12}$), 2.10-2.49 ppm (m, 4H, $CH_2$, $H^{23}$), 1.43 ppm (s, 18H, t-butyl of COO), 0.93 ppm (d, 6H, $CH_3$, $H^{21}$), 0.87 ppm (s, 6H, $CH_3$, $H^{19}$) and 0.64 ppm (s, 6H, $CH_3$, $H^{18}$). From the analysis of the $^1$H-NMR spectrum, it was confirmed that the final product was 1,3-adamantanedicarboxylic acid bis(tert-butylcholate) ester.

EXAMPLE 4

Synthesis of 1,3-Adamantanedicarboxylic Acid Bis(1-(tert-butoxy)ethylcholate) Ester About 2 g of 1,3-adamantanedicarboxylic acid bis(1-(tert-butoxy)ethylcholate) ester was obtained by performing substantially the same processes as those of Example 3, except that 1-(tert-butoxy)ethylcholate was used instead of tert-butylcholate. The yield of 1,3-adamantanedicarboxylic acid bis(1-(tert-butoxy)ethylcholate) ester was about 70%.

A structure of the final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 2H, H$^3$), 3.94 ppm (s, 2H, H$^{12}$), 2.10-2.49 ppm (m, 4H, CH$_2$, H$^{23}$), 1.21 ppm (s, 18H, t-butyl), 0.93(d, 6H, CH$_3$, H$^{21}$), 0.87(s, 6H, CH$_3$, H$^{19}$) and 0.64(s, 6H, CH$_3$, H$^{18}$). From the analysis of the $^1$H-NMR spectrum, it was confirmed that the final product was 1,3-adamantanedicarboxylic acid bis(1-(tert-butoxy)ethylcholate) ester.

EXAMPLE 5

Synthesis of 1,3-Adamantanediacetic Acid Bis(tert-butylcholate) Ester

About 2 g of 1,3-adamantanediacetic acid bis(tert-butylcholate) ester was obtained by performing substantially the same processes as those of Example 3, expect that 1,3-adamantanediacetic acid was used instead of 1,3-adamantanedicarboxylic acid. The yield of 1,3-adamantanediacetic acid bis(tert-butylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in. chloroform-d (CDCl$_3$). The $^1$H-NMR spectrum showed chemical shifts (δ) of the final product at 4.68 ppm (m, 2H, H$^3$), 3.94 ppm (s, 2H, H$^{12}$), 2.10-2.49 ppm (m, 4H, CH$_2$, H$^{23}$), 2.17 ppm (s, 2H, acetyl), 1.43 ppm (s, 18H, t-butyl of COO), 0.93 ppm (d, 6H, CH$_3$, H$^{21}$), 0.87 ppm (s, 6H, CH$_3$, H$^{19}$) and 0.64 ppm (s, 6H, CH$_3$, H$^{18}$). From the analysis of the $^1$H-NMR spectrum, it was confirmed that the final product was 1,3-adamantanediacetic acid bis(tert-butylcholate) ester.

EXAMPLE 6

Synthesis of 1,3-Adamantanediacetic Acid Bis(1-(tert-butoxy)ethylcholate) Ester

About 2 g of 1,3-adamantanediacetic acid bis(1-(tert-butoxy)ethylcholate) ester was obtained by performing substantially the same processes as those of Example 5, except that 1-(tert-butoxy)ethylcholate was used instead of tert-butylcholate. The yield of 1,3-adamantanediacetic acid bis(1-(tert-butoxy)ethylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 2H, H$^3$), 3.94 ppm (s, 2H, H$^{12}$), 2.10-2.49 ppm (m, 4H, CH$_2$, H$^{23}$), 2.17 ppm (s, 2H, acetyl), 1.21 ppm (s, 18H, t-butyl), 0.93 ppm (d, 6H, CH$_3$, H$^{21}$), 0.87 ppm (s, 6H, CH$_3$, H$^{19}$) and 0.64 ppm (s, 6H, CH$_3$, H$^{18}$). From the analysis of the $^1$H-NMR spectrum, it was confirmed that the final product was 1,3-adamantanediacetic acid bis(1-(tert-butoxy)ethylcholate) ester.

EXAMPLE 7

Synthesis of 1,3,5,7-Adamantanetetracarboxylic Acid Tetrakis(tert-butylcholate) Ester About. 3 g of 1,3,5,7-adamantanetetracarboxylic acid tetrakis(tert-butylcholate) ester was obtained by performing substantially the same processes as those of Example 3, expect that 1,3,5,7-adamantanetetracarboxylic acid was used instead of 1,3-adamantanedicarboxylic acid, and about 5 g of tert-butylchloate was used instead of about 3 g of tert-butylcholate. The yield of 1,3,5,7-adamantanetetracarboxylic acid tetrakis(tert-butylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 4H, H$^3$), 3.94 ppm (s, 4H, H$^{12}$), 2.10-2.49 ppm (m, 8H, CH$_2$, H$^{23}$), 1.43ppm (s, 36H, t-butyl of COO), 0.93 ppm (d, 12H, CH$_3$, H$^{12}$), 0.87 ppm (s, 12H, CH$_3$, H$^{19}$) and 0.64 ppm (s, 12H, CH$_3$, H$^{18}$). From the analysis of the $^1$H-NMR spectrum, it was confirmed that the final product was 1,3,5,7-adamantanetetracarboxylic acid tetrakis(tert-butylcholate) ester.

EXAMPLE 8

Synthesis of 1,3,5,7-Adamantanetetracarboxylic Acid Tetrakis(1-(tert-butoxy)ethylcholate) Ester About 3 g of 1,3,5,7-adamantanetetracarboxylic acid tetrakis(1-(tert-butoxy)ethylcholate) ester was obtained by performing substantially the same processes as those of Example 7, expect that about 5 g of 1-(tert-butoxy)ethylcholate was used instead of about 5 g of tert-butylcholate. The yield of 1,3,5,7-adamantanetetracarboxylic acid tetrakis(1-(tert-butoxy)ethylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 4H, H$^3$), 3.94 ppm (s, 4H, H$^{12}$), 2.10-2.49 ppm (m, 8H, H$^{23}$), 1.21 ppm (s, 36H, t-butyl), 0.93 ppm (d, 12H, CH$_3$, H$^{21}$), 0.87 ppm (s, 12H, CH$_3$, H$^{19}$) and 0.64 ppm (s, 12H, CH$_3$, H$^{18}$). From the analysis of the $^1$H-NMR spectrum, it was confirmed that the final product was 1,3,5,7-adamantanetetracarboxylic acid tetrakis(1-(tert-butoxy)ethylcholate) ester.

EXAMPLE 9

Synthesis of 1,4-Cyclohexanedicaboxylic acid Bis(tert-butylcholate) Ester

About 2.5 g of 1,4-cyclohexanedicarboxylic acid bis(tert-butylcholate) ester was obtained by performing substantially the same processes as those of Example 3, except that 1,4-cyclohexanedicarboxylic acid was used instead of 1,3-adamantanedicarboxylic acid. The yield of 1,4-cyclohexanedicarboxylic acid bis(tert-butylcholate) ester was about 80%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 2H, H$^3$), 3.94 ppm (s, 2H, H$^{12}$), 2.10-2.49 ppm (m, 4H, H$^{23}$), 1.43 ppm (s, 18H, t-butyl of COO), 0.93 ppm (d, 6H, CH$_3$, H$^{21}$), 0.87 ppm (s, 6H, CH$_3$, H$^{19}$) and 0.64 ppm (s, 6H, CH$_3$, H$^{18}$). From the analysis of the $^1$H-NMR spectrum, it was confirmed that the final product was 1,4-cyclohexanedicaboxylic acid bis(tert-butylcholate) ester.

EXAMPLE 10

Synthesis of 1,4-Cyclohexanedicarboxylic Acid Bis(1-(tert-butoxy)ethylcholate) Ester About 2 g of 1,4-cyclohexanedicarboxylic acid bis(1-(tert-butoxy)ethylcholate) ester was obtained by performing substantially the same processes as those of Example 9, except that 1-(tert-butoxy)ethylcholate was used instead of tert-butylcholate. The yield of 1,4-cyclohexanedicarboxylic acid bis(1-(tert-butoxy)ethylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 2H, H$^3$), 3.94 ppm (s, 2H, H$^{12}$), 2.10-2.49 ppm (m, 4H, H$^{23}$), 1.21 ppm (s, 18H, t-butyl), 0.93 ppm (d, 6H, CH$_3$, H$^{21}$), 0.87 ppm (s, 6H, CH$_3$, H$^{19}$) and 0.64(s, 6H, CH$_3$, H$^{18}$), From the analysis of the $^1$H-NMR spectrum, it was confirmed that the final product was 1,4-cyclohexanedicarboxylic acid bis(1-(tert-butoxy)ethylcholate) ester.

EXAMPLE 11

Synthesis of 1,3,5-Cyclohexanetricarboxylic Acid Tris(tert-butylcholate) ester

About 3 g of 1,3,5-cyclohexanetricarboxylic tris(tert-butylcholate) ester was obtained by performing substantially the same processes as those of Example 3, except that 1,3,5-cyclohexanetricarboxylic acid was used instead of 1,3-adamantanedicarboxylic acid and using about 4 g of tert-butylcholate instead of about 3 g of tert-butylcholate. The yield of 1,3,5-cyclohexanetricarboxylic acid tris(tert-butylcholate) ester was about 80%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 3H, H$^3$), 3.94 ppm (s, 3H, H$^{12}$), 2.10-2.49 ppm (m, 6H, CH$_2$, H$^{23}$), 1.43 ppm (s, 27H, t-butyl of COO), 0.93 ppm (d, 9H, CH$_3$, H$^{21}$), 0.87 ppm (s, 9H, CH$_3$, H$^{19}$) and 0.64 ppm (s, 9H, CH$_3$, H$^{18}$). From the analysis of the $^1$H-NMR spectrum, it was confirmed that the final product was 1,3,5-cyclohexanetricarboxylic acid tris(tert-butylcholate) ester.

EXAMPLE 12

Synthesis of 1,3,5-Cyclohexanetricarboxylic Acid Tris(1-(tert-butoxy)ethylcholate) Ester About 3 g of 1,3,5-cyclohexanetricarboxylic acid tris(1-(tert-butoxy)ethylcholate) ester was obtained by performing substantially the same processes as those of Example 11, except that 1-(tert-butoxy)ethylcholate was used instead of tert-butylcholate. The yield of 1,3,5-cyclohexanetricarboxylic acid tris(1-(tert-butoxy)ethylcholate) ester was about 70%.

A structure of a final product was confirmed using a 1H-nuclear magnetic resonance ($^1$H-NMR) spectrum. The $^1$H-NMR spectrum showed chemical shifts (δ) of the final product dissolved in chloroform-d (CDCl$_3$). The $^1$H-NMR spectrum showed chemical shifts (δ) of the final product at 4.68 ppm (m, 3H, H$^3$), 3.94 ppm (s, 3H, H$^{12}$), 2.10-2.49 ppm (m, 6H, CH$_2$, H$^{23}$), 1.21 ppm (s, 27H, t-butyl), 0.93 ppm (d, 8H, CH$_3$, H$^{21}$), 0.87 ppm (s, 8H, CH$_3$, H$^{19}$) and 0.64 ppm (s, 8H, CH$_3$, H$^{18}$). From the analysis of the $^1$H-NMR spectrum, it was confirmed that the final product was 1,3,5-cyclohexanetricarboxylic acid tris(1-(tert-butoxy)ethylcholate) ester.

Preparation of a Photoresist Composition and Formation of a Photoresist Pattern

Figure 4:
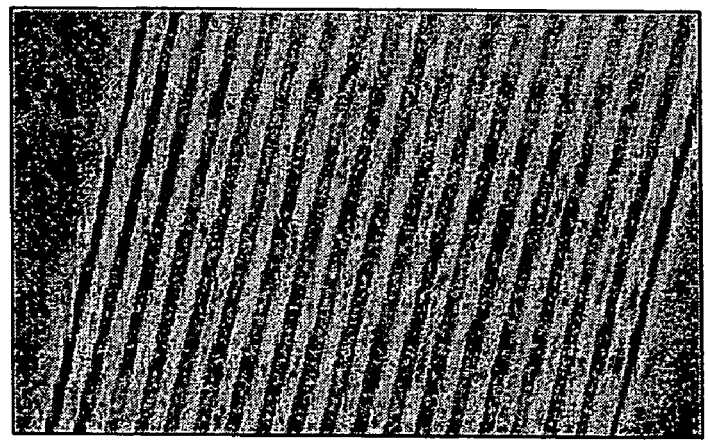
FIG. 4 is an electron microscopic image showing a photoresist pattern formed using a photoresist composition including a cyclic compound in accordance with an example embodiment of the present invention.

FIG. 4 is an electron microscopic image showing the photoresist pattern formed using the photoresist composition in an example embodiment of the present invention.

Preparation of a photoresist composition was performed in a laboratory in which a far ultraviolet ray was blocked. About 0.2 g of the cyclic compound obtained in Example 3 and about 0.004 g of triphenylsulfonium triflate used as a photoacid generator were dissolved in about 1.5 g of propyleneglycol monomethyl ether acetate, and then the resulting product was filtered using a membrane filter of about 0.2 μm. As a result, a photoresist composition was obtained. Thereafter, the photoresist composition was spin-coated on a silicon wafer, and then the silicon wafer was heated at a temperature of about 100° C. for about 90 seconds. As a result, a photoresist film having a thickness of about 0.4 μm was formed on the silicon wafer. The photoresist film was exposed to light using a DUV exposure apparatus, and then the phtoresist film was thermally treated again at a temperature of about 120° C. for about 90 seconds. The photoresist film was developed using about 2.38 percent by weight of a tetramethylammonium hydroxide aqueous solution for about 90 seconds. Accordingly, a photoresist pattern was formed on the silicon wafer as shown in FIG. 4.

As shown in FIG. 4, the photoresist pattern was well formed using the photoresist composition in an example embodiment of the present invention. Particularly, it may be noted that the photoresist pattern has a uniform line width of about 0.8 μm and favorable profile characteristics.

The foregoing is illustrative of the present invention and is riot to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A cyclic compound for a photoresist composition, said cyclic compound having a chemical structure represented by a formula (5), (6), (7) or (8),

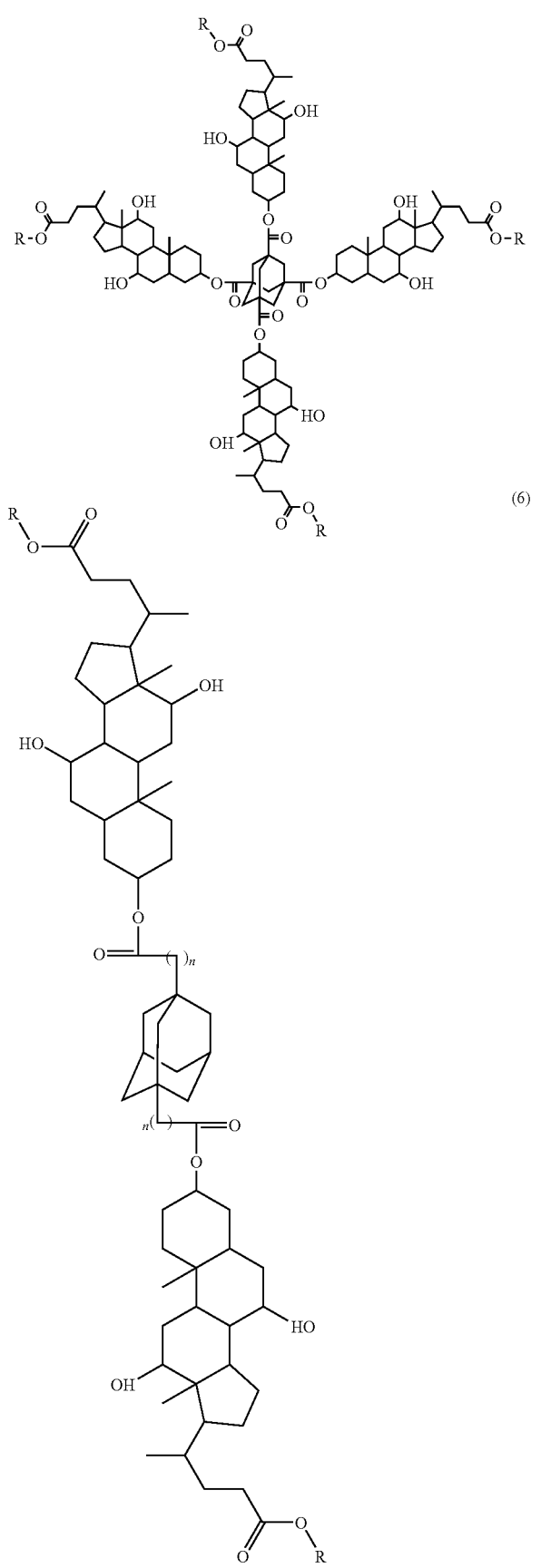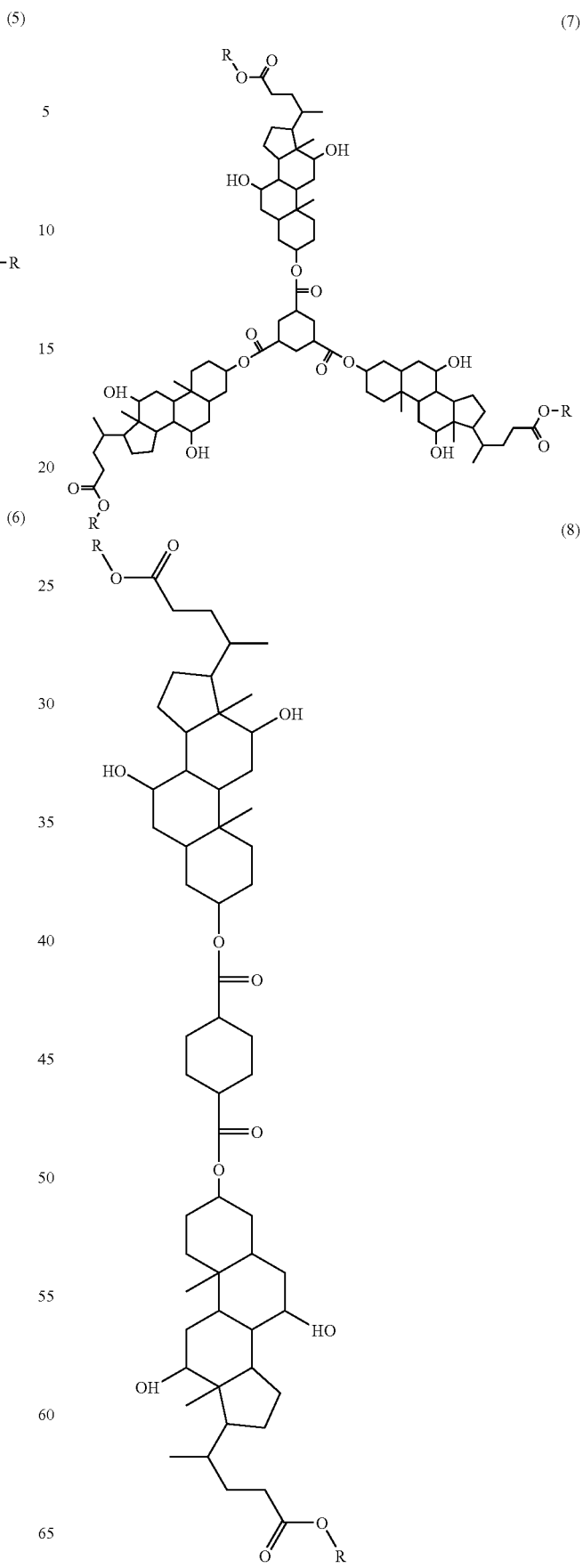

wherein in the formulas (5), (6), (7) and (8), R is a tert-butyl group or a 1-(tert-butoxy)ethyl group, and n is 0 or 1.

2. The cyclic compound of claim 1, wherein the cyclic compound has the chemical structure represented by the formula (5) and is synthesized by reacting 1,3,5,7-adamantane-tetracarboxylic acid with tert-butylcholate or 1-(tert-butoxy)ethylcholate.

3. The cyclic compound of claim 1, wherein the cyclic compound has the chemical structure represented by the formula (6) and is synthesized by reacting 1,3-adamantanedicarboxylic acid with tert-butylcholate or 1-(tert-butoxy)ethylcholate.

4. The cyclic compound of claim 1, wherein the cyclic compound has the chemical structure represented by the formula (6) and is synthesized by reacting 1,3-adamantanediacetic acid with tert-butyicholate or 1-(tert-butoxy)ethylcholate.

5. The cyclic compound of claim 1, wherein the cyclic compound has the chemical structure represented by the formula (7) and is synthesized by reacting 1,3,5-cyclohexanetricarboxylic acid with tert-butylcholate or 1-(tert-butoxy)ethylcholate.

6. The cyclic compound of claim 1, wherein the cyclic compound has the chemical structure represented by the formula (8) and is synthesized by reacting 1,4-cyclohexanedicrboxylic acid with tert-butylcholate or 1-(tert-butoxy)ethylcholate.

7. A photoresist composition comprising:
a cyclic compound having a chemical structure represented by a formula (5), (6), (7) or (8);
a photoacid generator; and
an organic solvent,

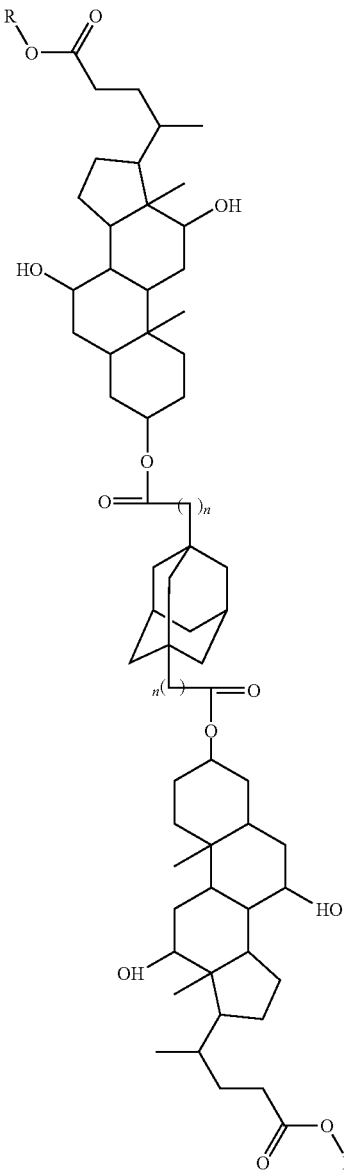

(6)

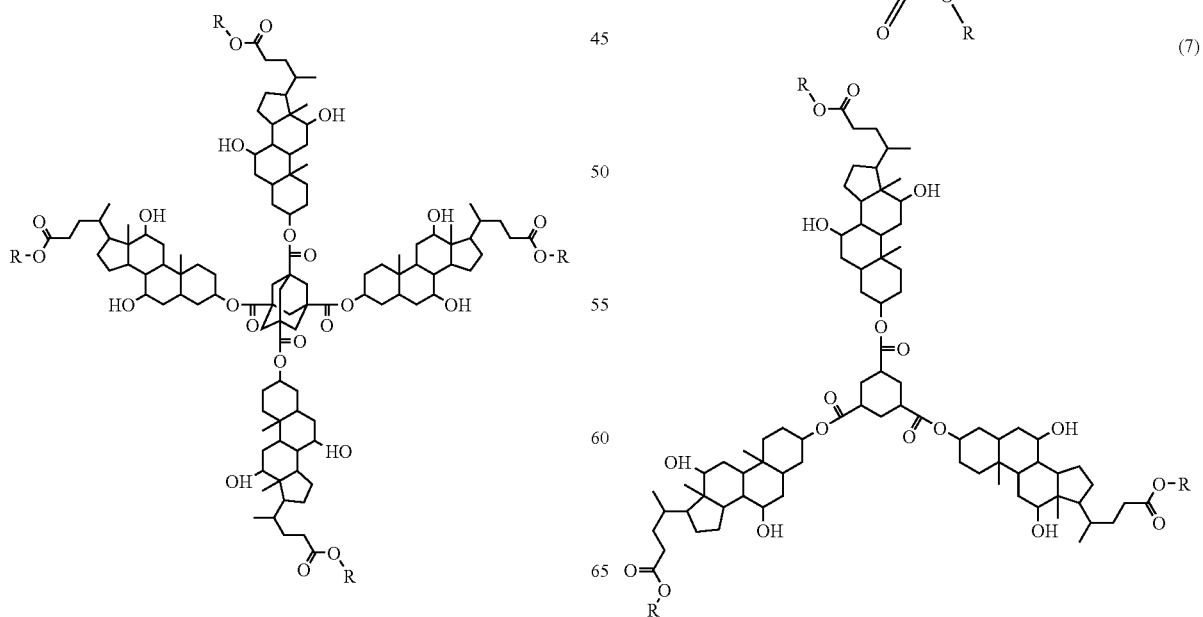

(5)

(7)

(8)

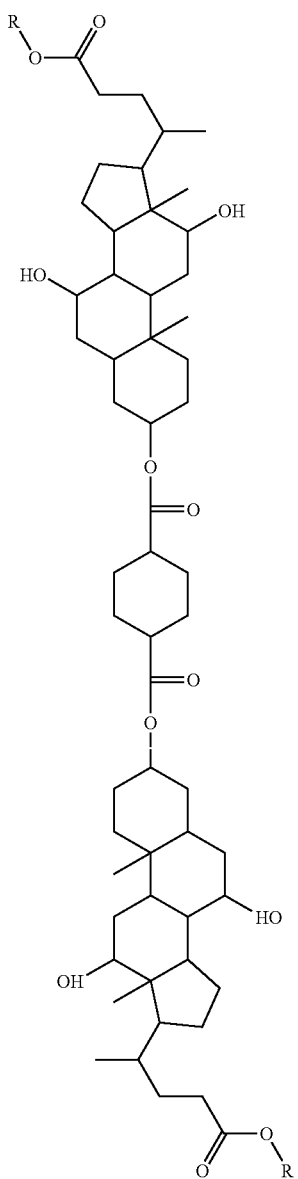

(5)

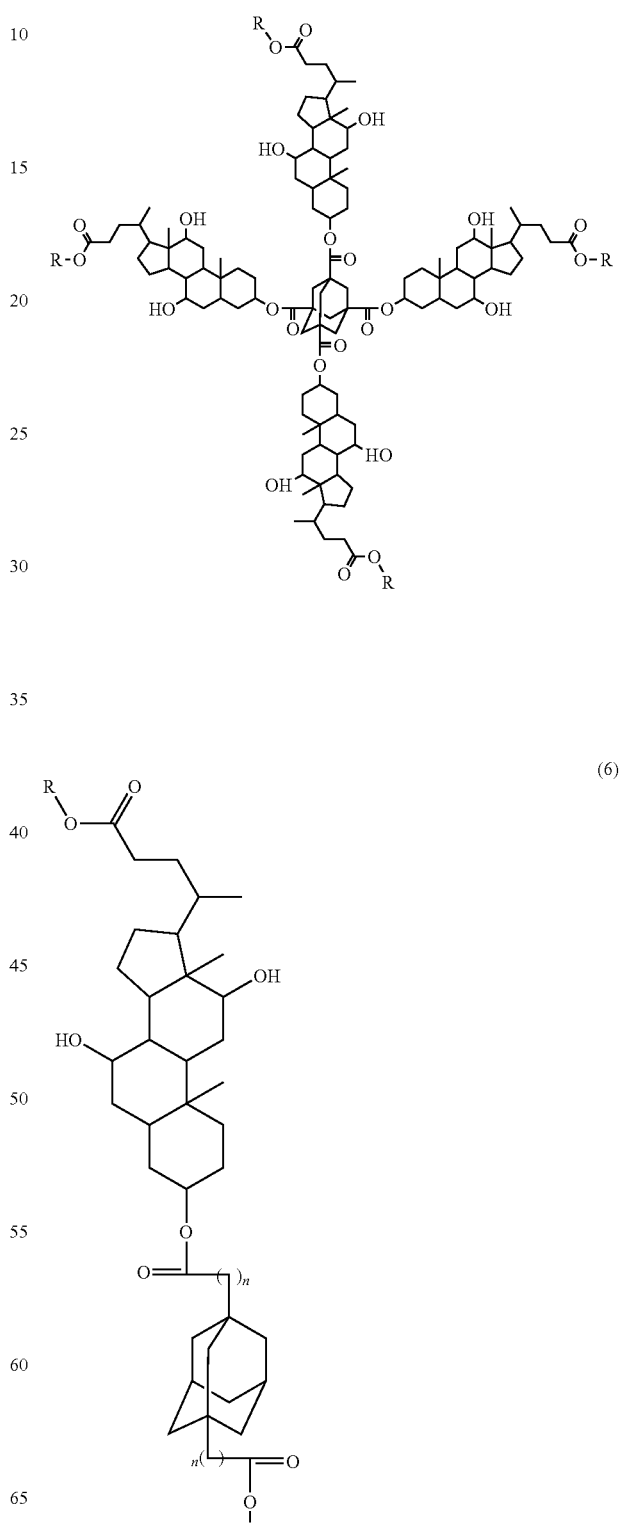

(6)

wherein in the formulas (5), (6), (7) and (8), R is a tert-butyl group or a 1-(tert-butoxy)ethyl group, and n is 0 or 1.

8. The photoresist composition of claim 7, wherein the composition includes about 7 to about 14 percent by weight of the cyclic compound, and about 0.1 to about 0.5 percent by weight of the photoacid generator.

9. The photoresist composition of claim 7, wherein the photoacid generator comprises at least one selected from the group consisting of a triarylsulfonium salt, a diaryliodonium salt, a sulfonate and N-hydroxysuccinimide triflate.

10. A method of forming a pattern comprising:
 forming a photoresist film on an object by coating the object with a photoresist composition including a cyclic compound, a photoacid generator and an organic solvent, the cyclic compound having a chemical structure represented by a formula (5), (6), (7) or (8);
 exposing the photoresist film to light by performing an exposure process; and
 developing the photoresist film using a developing solution to form a photoresist pattern,

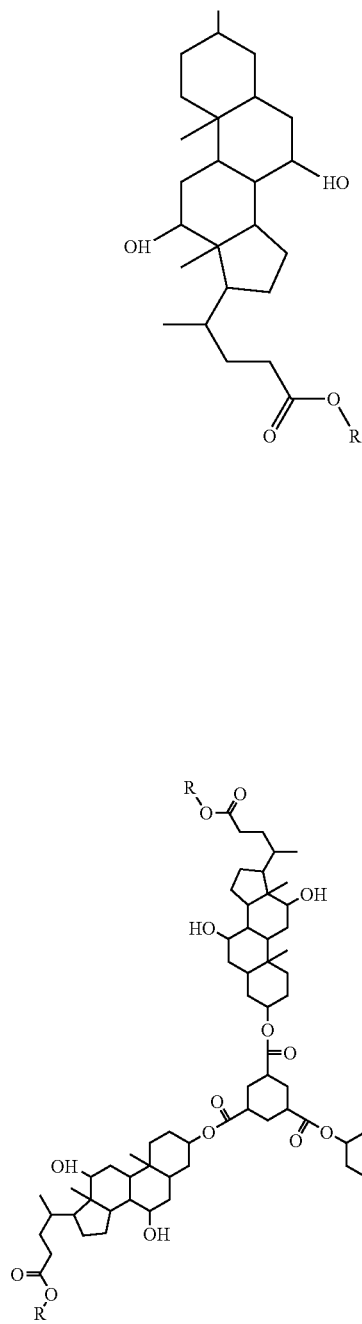

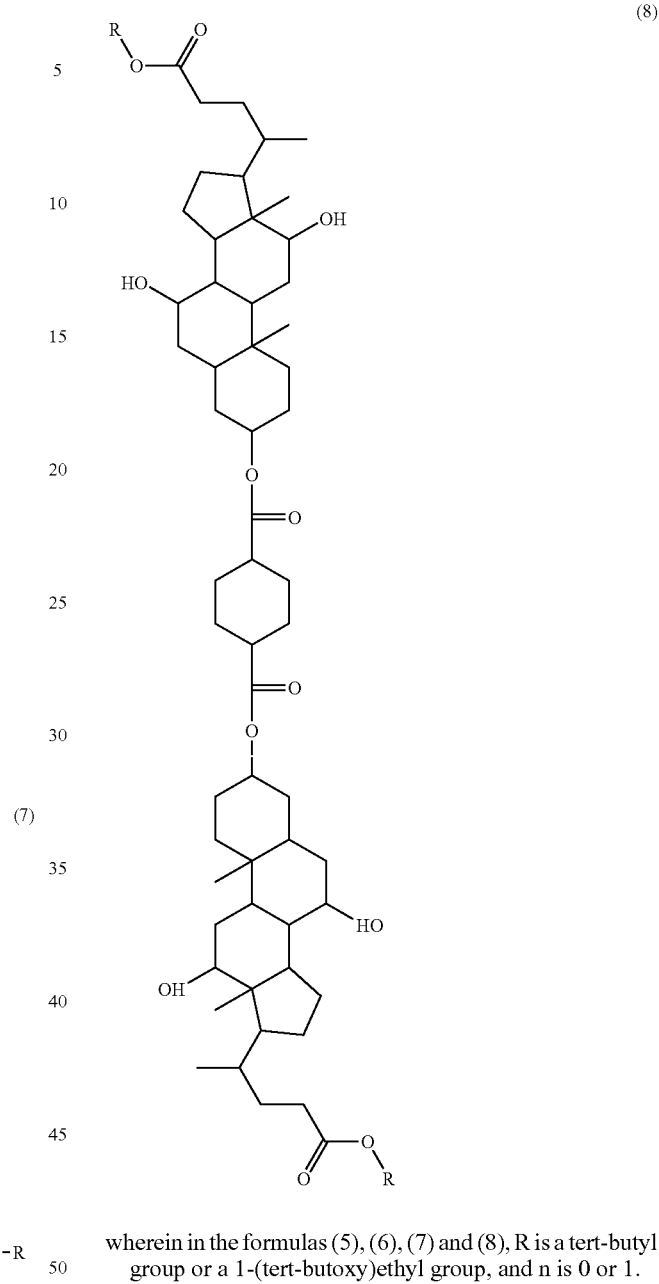

wherein in the formulas (5), (6), (7) and (8), R is a tert-butyl group or a 1-(tert-butoxy)ethyl group, and n is 0 or 1.

11. The method of claim 10, wherein the composition includes about 7 to about 14 percent by weight of the cyclic compound, and about 0.1 to about 0.5 percent by weight of the photoacid generator.

12. The method of claim 10, further comprising, prior to developing the photoresist film:
thermally treating the photoresist film at a temperature of about 100° C. to about 140° C.

13. The method of claim 10, wherein the exposure process is performed by utilizing a far ultraviolet laser, an F2 laser, an X-ray or an ion beam as a light source.

* * * * *